United States Patent [19]

Knickerbocker

[11] Patent Number: 4,620,765

[45] Date of Patent: Nov. 4, 1986

[54] EIGHT CONDUCTOR MODULAR TEST ADAPTER

[75] Inventor: Robert H. Knickerbocker, Chesire, Conn.

[73] Assignee: The Siemon Company, Watertown, Conn.

[21] Appl. No.: 634,817

[22] Filed: Jul. 26, 1984

[51] Int. Cl.$^4$ .............................................. H01R 13/50
[52] U.S. Cl. .......................... 339/154 A; 339/176 M; 339/11; 339/119 R
[58] Field of Search ............... 339/154, 156, 157, 159, 339/166, 168, 170, 198 R, 194, 11, 119 L, 119 R, 125 L, 107, 176 R, 176 M

[56] References Cited

U.S. PATENT DOCUMENTS

| | | | |
|---|---|---|---|
| 2,354,598 | 7/1944 | Janz | 339/119 L |
| 2,714,712 | 8/1955 | Riccardelli | 339/157 C |
| 2,723,384 | 11/1955 | Lang | 339/194 R |
| 3,380,015 | 4/1968 | Gaines et al. | 339/107 |
| 3,990,763 | 11/1976 | Kress | 339/156 R |
| 4,047,787 | 9/1977 | Gumb et al. | 339/154 A |
| 4,154,499 | 5/1979 | Weber | 339/194 N |
| 4,224,485 | 9/1980 | Krumreich | 339/176 M |
| 4,402,560 | 9/1983 | Swainbank | 339/11 |
| 4,407,559 | 10/1983 | Meyer | 339/176 M |
| 4,447,106 | 5/1984 | Houtz et al. | 339/176 M |
| 4,483,577 | 11/1984 | Novis | 339/176 M |
| 4,493,951 | 1/1985 | Sanderson et al. | 339/156 R |
| 4,500,160 | 2/1985 | Bertsch | 339/206 R |

*Primary Examiner*—Gil Weidenfeld
*Assistant Examiner*—David L. Pirlot
*Attorney, Agent, or Firm*—Fishman & Dionne

[57] ABSTRACT

An 8 wire modular plug ended test adapter capable of insertion into any 6 or 8 wire modular jack is presented. The modular adapter comprises 8 conductive contacts encased in a plastic housing, and respectively attached to 8 wires preferably leading from a modular plug, the contacts being sufficiently wide to accommodate alligator chips or the like. Pair number of contacts are clearly molded onto the housing to facilitate use. The modular adapter provides access to a 6 or 8 wire jack for telephone butt sets, test equipment, etc.

27 Claims, 9 Drawing Figures

EIGHT CONDUCTOR MODULAR TEST ADAPTER

BACKGROUND OF THE INVENTION

This invention relates to a modular plug ended test adapter for use in the telephonic and related industries. More particularly, this invention relates to a new and improved 8-wire modular test adapter which can be used interchangeably with any 6 or 8 wire modular jack. The modular adapter of the present invention provides access to a 6 or 8 wire jack for hooking up to telephone butt sets, test equipment, etc.

In the telephonic and related arts, there is a great need for testing or interfacing often complicated wiring during installation and repairs. Consequently, test adapters are urgently needed for effecting communication between telephone butt sets, test equipment, tone generators, etc.

With the advent of modular jacks for telephone equipment, such test adapters should preferably be modular plug ended so as to interface with equipment having modular jacks. Alternatively, such test adapters should also have the ability to be "hardwired" directly onto selected telephone equipment.

It is well known that modular plugs for 8 wire jacks differ in size from 6 wire modular plugs. As a result, different prior art modular test adapters have had to be used depending upon the modular jack which is to be interfaced (i.e., 6 wire plug, 8 wire plug, etc.). This has created extra purchasing and manufacturing costs as well as complicating repair and installation activity.

SUMMARY OF THE INVENTION

The above discussed and other problems of the prior art are overcome or alleviated by the modular test adapter of the present invention. In accordance with the present invention, a novel "universal" 8-wire modular plug ended test adapter is presented which is capable of interfacing or plugging into any 6 or 8 wire modular jack. It will be understood that a 6 or 8 wire modular jack may have 1 or 2 pairs, i.e., be 2 or 4 wires. Moreover, the contacts are sufficiently wide enough to accommodate almost any size alligator clip typically used by the telephonic industry. The novel 8 wire modular plug disclosed herein which can fit into any 6 or 8 wire modular jack is set forth in more detail in U.S. patent application Ser. No. 634,818, filed contemporaneously with the present application, assigned to the assignee hereof and incorporated herein by reference.

The modular test adapter of the present invention, therefore, provides heretofore unknown versatility and capabilities relative to prior art modular adapters. Accordingly, as the present invention permits the use of only one modular test adapter for 6 or 8 wire jacks, great cost savings and ease of use are achieved thereby. It will be appreciated that the modular plug test adapter of the present invention may also be directly wired to telephone access or test equipment such as the modular test plug adapter found in U.S. patent application Ser. No. 634,816 filed contemporaneously with the present application, assigned to the assigee hereof and incorporated herein by reference.

The present invention can be used in conjunction with many known telephone test set adapters or to insert a tone or test up to 4 pairs of wires directly on a 66 quick connect M block. In addition, the present invention can be used to test such USOC's as RJ11C, RJ12C, RJ13C, RJ14C, etc. Many other suitable applications of the present invention will be apparent to those skilled in the art.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several figures.

DESCRIPTION OF THE PREFERRED EMBODIMENT

Figure 1:
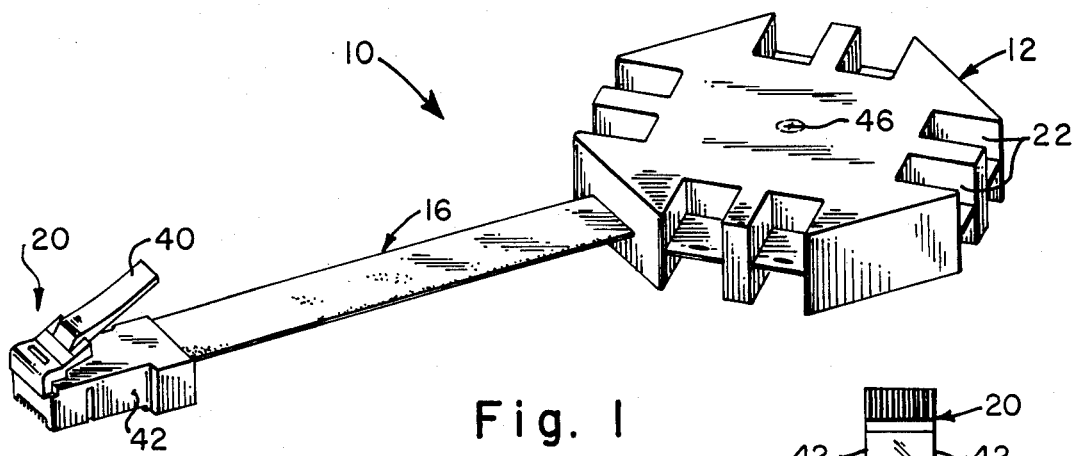
FIG. 1 is a perspective view of the modular adapter in accordance with the present invention.
Figure 2:
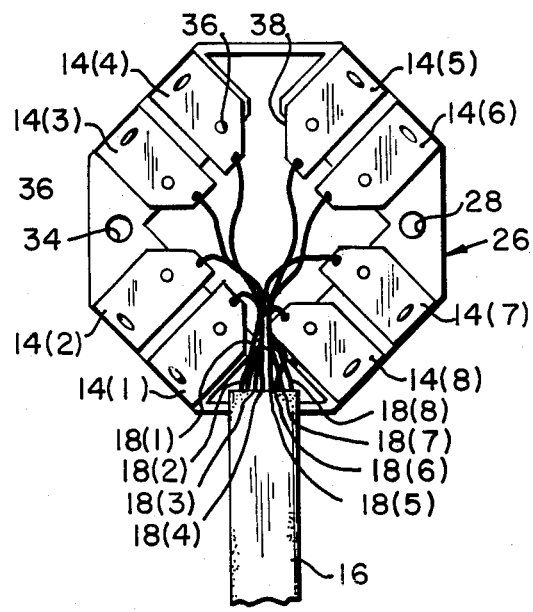
FIG. 2 is a plan view of the modular adapter of FIG. 1 with the top cover removed.

Referring jointly to FIGS. 1 and 2, a modular adapter in accordance with the present invention is shown generally at 10. The adapter 10 is comprised of a relatively small number of component parts including a housing 12 holding eight (8) metal contacts 14(1)–14(8) therein and a lead 16 having eight wires 18(1)–18(8) therein which interconnect contacts 14 and modular jack 20.

Figure 3:
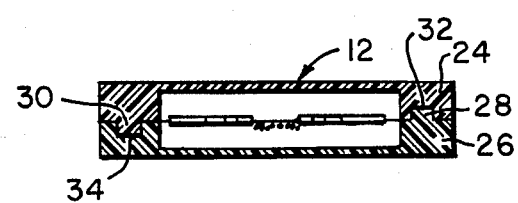
FIG. 3 is a cross-sectional elevation view of the modular adapter of FIG. 1 along the line 3—3 of FIG. 4.

The housing 12 has a substantially octagonal shape with eight slots 22 (four groups of two slots) being provided to allow access of the contacts 14 by alligator clips (not shown) or other connecting means. Preferably, housing 12 is comprised of two mirror image molded sections 24 and 26 (FIG. 3) interlocked by a pair of locating projections 28, 30 having corresponding apertures 32, 34, the two sections 24, 26 then being ultrasonically welded. Also, in a preferred embodiment, the housing 12 is comprised of a strong, impact resistant plastic material such as a polycarbonate or the like.

Figure 6:
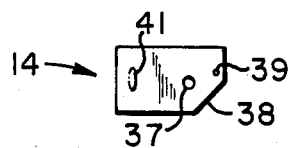
FIG. 6 is a plan view of an enlarged contact from FIG. 1 and in accordance with the present invention.

Referring to FIGS. 2 and 6, section 26 of housing 12 is provided with eight positioning pins or posts 36 which are used in locating and engaging the eight contacts 14 within housing 12. Preferably, after contacts 14 have been placed on positioning posts 36 via first apertures 37, the posts 36 are heated whereupon they will flow and securely lock the contacts 14 thereon. Posts 36 also act to bond the two sections 24 and 26 of the housing 12 during ultrasonic welding. Preferably, contacts 14 each have a diagonally cut corner edge 38. Cut corner edge 38 prevents overlap (and resultant shorting) between adjacent contacts 14. Note that in a preferred embodiment, one contact which is located closest to lead 16, i.e., contact 14(1) or 14(8), acts to hold down wires 18 prior to welding of sections 24, 26 of housing 12.

Contacts 14(1)–14(8) are comprised of a suitable electrically conductive material such as copper or phosphor bronze (either of which may be tin-lead plated) and are each connected to the modular jack 20 via a wire 18(1)–18(8). Wires 18(1)–(8) are preferably passed through a second aperture 39 in each contact 14 and then soldered or otherwise permanently connected thereto. It should be appreciated that contacts 14 are sufficiently wide enough to accommodate almost any size alligator clip typically used by the telephonic industry. Note that contacts 14 are also provided with bumps 41 (FIG. 6) to effect improved engagement by an alligator clip.

Figure 7:
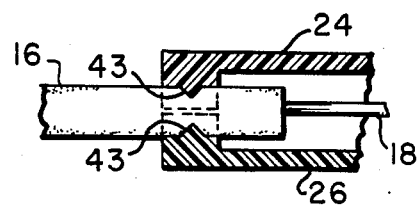
FIG. 7 is a cross-sectional elevation view along the line 7—7 of FIG. 8.

Each section 24,26 of housing 12 preferably includes means for firmly gripping or clamping lead 16 therebetween. For example, in FIG. 7, each section 24,26 has a V-shaped protrusion 43 molded therein and extending upwardly therefrom which acts to clamp down and pinch lead 16 during assembly of housing 12. These V-shaped protrusions 43 thus act to firmly grip and retain lead 16 in housing 12 and thereby prevent the lead 16 from being pulled therefrom.

Figure 4:
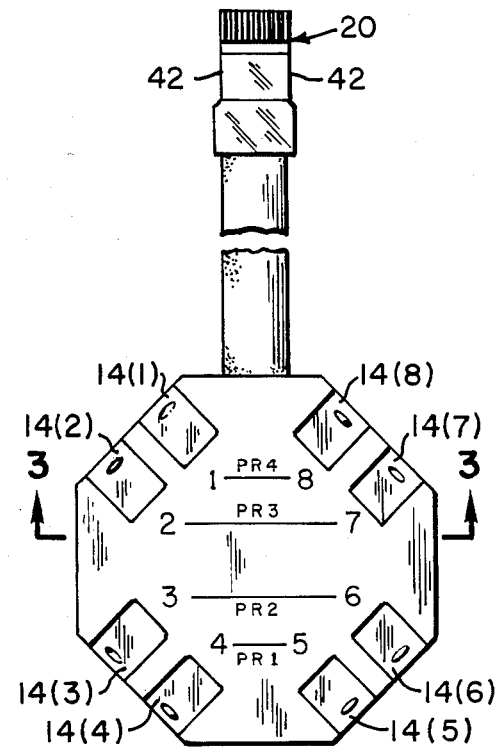
FIG. 4 is a bottom view of the modular adapter of FIG. 1.
Figure 5:
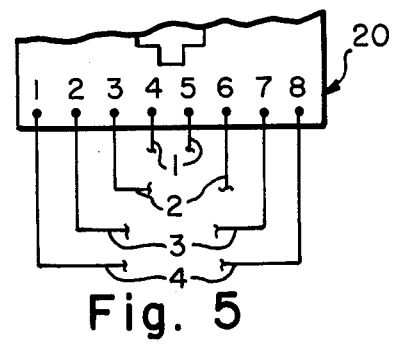
FIG. 5 is a schematic view showing the wiring configuration of the modular adapter in accordance with the present invention.

Referring to FIGS. 4 and 5, pair numbers of contacts are clearly molded into the plastic housing 12 and apply equally to either 6 or 8 wire jacks. Accordingly, contacts 14(4) and 14(5) are each connected to wires or conductors 18(4) and 18(5) respectively and comprise pair number 1. Similarly, contacts 14(3) and 14(6) are connected to wires 18(3) and 18(6), respectively and comprise pair number 2. In the same regard, contacts 14(2) and 14(7) form pair number 3 while contacts 14(1) and 14(8) form pair number 4.

Referring again to FIG. 1, modular plug 20 is connected by lead 16 to the housing 12. Plug 20 has attached thereto a conventional snap-lock lever 40. However, the novel 8 wire modular jack 20 has been modified so that it is capable of fitting into any 6 or 8 wire modular jack. This novel improvement is effected by providing stepped-in side portions 42 as described in U.S. patent application Ser. No. 634,818. Thus, unlike a conventional 8 wire modular plug which has a wider casing relative to 6 wire plugs, the novel plug of the present invention has "universal" sizing for either 6 or 8 wire modular jack applications.

As mentioned, the 8 wire modular plug ended adapter will fit into any 6 or 8 wire modular jack and provide access to the jack for telephone butt sets, test equipment, tone generators, etc. utilizing conventional alligator clips (not shown) which are removably attached to a paired number of contacts. Thus, in order to test the wiring of pair number 1, alligator clips are attached to contacts 14(4) and 14(5). Similarly, other wiring circuits are tested by attaching the clips to the respective contacts of a pair number. In this way, all 8 wires (4 pairs) from an 8 wire modular jack may be easily and quickly tested.

As discussed, the novel modular plug of the present invention can also fit a 6 wire modular jack. For example, in the case of a 6 wire modular jack, pair number 4 (see FIGS. 4 and 5) corresponding to contacts 14(1) and 14(8) and wire leads 18(1) and 18(8) will be inoperable. Accordingly only three pair numbers (i.e., pairs 1–3) will be tested when using a 6 wire jack. However, in some applications, six or eight wire modular jacks may include only one or two pairs. In those cases only pairs 1 and 2 or just pair 1 corresponding to contacts 14(4), 14(5) and 14(3), 14(6) will be utilized.

Thus, unlike prior art modular adapters, the 8 wire modular plug ended adapter of the present invention may be used in a 6 or 8 wire modular jack. This important feature of the present invention leads to greater cost savings in terms of manufacturing and purchasing as well as less complication for the telephone installer. Alternatively, the present invention may be used with standard prior art modular jacks or other suitable interface means or the present invention may be directly hardwired to a suitable access means such as the modular test plug adapter of U.S. patent application Ser. No. 634,816.

Figure 8:
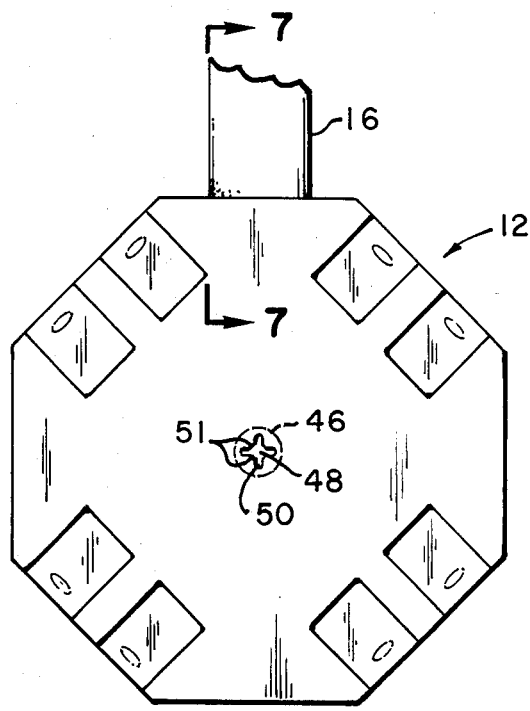
FIG. 8 is a plan view of a portion of the modular adapter in accordance with the present invention.
Figure 9:
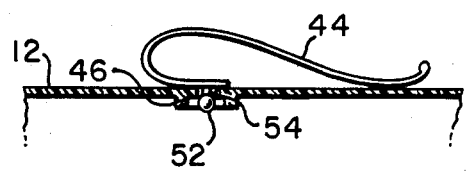
FIG. 9 is a cross-sectional elevation view along the line 9—9 of FIG. 8 with a spring clip attached thereto.

Referring now to FIGS. 8 and 9, in a preferred embodiment, housing 12 is provided with means for attaching a spring clip 44, closure button or the like. Thus, in FIG. 8, a snap lock hub 46 comprised of a planar circular hub having a center opening 48 therein and, for example, four slits 50 radially extending from the center opening 50 is shown. This structure permits the four segments located between slits 50 to be flexible and resilient. Referring to FIG. 9, spring clip 44 has a substantially round ball 52 attached thereto via shaft 54. Thus, as ball 50 is pushed through opening 48, the resilient segments flex outwardly and then snap back to firmly engage shaft 54. Spring clip 44 can then be attached to a shirt pocket or the like to permit ease of handling and storage. It should be understood that any other suitable carrying means may be utilized in place of spring clip 44.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A modular plug ended adapter comprising:
    an electrically insulating housing;
    eight electrically conductive contacts partially encased by said housing, each of said contacts being electrically isolated from the others of said contacts, a portion of each contact being exposed exterior of said housing said housing having a top surface, a bottom surface parallel to said top surface, and a plurality of opposing side surfaces between said top and bottom surfaces, at least one of said exposed contact portions being exposed at two or more of said side surfaces whereby, said exposed contact portions present substantially flat contact areas for connection with a testing device; and
    eight wire conductors leading from said housing, a first end of each of said eight conductors being mechanically and electrically connected to one of each of said contacts.

2. The adapter of claim 1 wherein:
    said housing is substantially octagonal.

3. The adapter of claim 1 including:
    means for locating said contacts within said housing.

4. The adapter of claim 1 including:
    means for preventing electrical shorting between said contacts within said housing.

5. The adapter of claim 1 wherein said contacts include at least one bump.

6. The adapter of claim 1 wherein said contacts include apertures for receiving said conductors.

7. The adapter of claim 1 wherein said housing includes:
    means for retaining said wires therein.

8. The adapter of claim 1 including:
means for identifying pair numbers of contacts.

9. The adapter of claim 8 wherein:
said housing includes a first and second surface; and
said identifying means is located on said first surface of said housing.

10. A modular plug ended adapter comprising:
an electrically insulating housing;
eight electrically conductive contacts partially encased by said housing, each of said contacts being electrically isolated from the others of said contacts, a portion of each contact being exposed exterior of said housing said housing having a top surface, a bottom surface parallel to said top surface, and a plurality of opposing side surfaces between said top and bottom surfaces, at least one of said exposed contact portions being exposed at two or more of said opposing side surfaces whereby said exposed contact portions present substantially flat contact areas for connection with a testing device; and
eight wire conductors leading from said housing, a first end of each of said eight conductors being mechanically and electrically connected to one of each of said contacts;
means for locating said contacts within said housing;
wherein said locating means includes pins; and
wherein said contacts include first apertures for receiving said pins.

11. A modular plug ended adapter comprising:
an electrically insulating housing;
eight electrically conductive contacts partially encased by said housing, each of said contacts being electrically isolated from the others of said contacts, a portion of each contact being exposed exterior of said housing said housing having a top surface, a bottom surface parallel to said top surface, and a plurality of opposing side surfaces between said top and bottom surfaces, at least one of said exposed contact portions being exposed at two or more of said opposing side surfaces whereby said exposed contact portions present substantially flat contact areas for connection with a testing device; and
eight wire conductors leading from said housing, a first end of each of said eightt conductors being mechanically and electrically connected to one of each of said contacts;
means for preventing electrical shorting between said contacts within said housing;
wherein said shorting preventing means includes said contacts being substantially rectangular and having at least one diagonal corner.

12. The adapter of claim 11 wherein said modular plug means includes:
means for connecting said contacts to a 6 or 8 wire modular jack.

13. The adapter of claim 12 wherein said modular plug means includes:
housing means, and wherein said housing means of said modular plug means includes;
means for permitting insertion of said modular plug means housing means into a 6 or 8 wire modular jack.

14. A modular plug ended adapter comprising:
an electrically insulating housing;
eight electrically conductive contacts partially encased by said housing, each of said contacts being electrically isolated from the others of said contacts, a portion of each contact being exposed exterior of said housing;
eight wire conductors leading from said housing, a first end of each of said eight conductors being mechanically and electrically connected to one of each of said contacts;
modular plug means for connecting said contacts to a modular jack, said modular plug means being electrically and mechanically connected to a second end of each of said eight conductors; and
said modular plug means including housing means, wherein said housing means includes;
means for permitting insertion of said modular plug means into a 6 or 8 wire modular jack; said means for permitting insertion comprising;
opposite insertable side portions on said modular plug means which are stepped inwardly thereby being insertable into either a 6 or 8 wire modular jack.

15. The adapter of claim 1 wherein said housing is comprised of two substantially identical sections.

16. The adapter of claim 15 wherein:
said two sections are ultrasonically welded together.

17. The adapter of claim 15 wherein said retaining means includes:
at least two oppositely disposed V-shaped protusions located on each section wherein said wires are clamped therebetween.

18. The adapter of claim 1 including:
means for carrying said housing; and
means for attaching said carrying means to said housing, said attaching means being located on said housing.

19. The adapter of claim 18 wherein said attaching means comprises:
snap lock means.

20. The adapter of claim 18 wherein said carrying means comprises:
spring clip means, said spring clip means including means for mating with said attaching means.

21. A modular plug ended adapter comprising:
an electrically insulating housing;
eight electrically conductive contacts partially encased by said housing, each of said contacts being electrically isolated from the other of said contacts, a portion of each contact being exposed exterior of said housing;
eight wire conductors leading from said housing, a first end of each of said eight conductors being mechanically and electrically connected to one of each of said contacts;
means for carrying said housing; and
means for attaching said carrying means to said housing, said attaching means being located on said housing, said attaching means comprising snap lock means wherein said snap lock means comprises;
a circular hub having a central opening therein; and
a plurality of slits radially extending from said central opening, said slits defining flexible segments therebetween.

22. The adapter of claim 21 wherein said carrying means comprises:
spring clip means, said spring clip means including means for mating with said attaching means.

23. The adapter of claim 22 wherein said mating means comprises:
a substantially round ball attached to said spring clip means via a shaft.

24. A modular plug ended adapter comprising:
an electrically insulating housing;
eight electrically conductive contacts partially encased by said housing, each of said contacts being electrically isolated from the others of said contacts;
eight wire conductors leading from said housing, a first end of each of said eight conductors being mechanically and electrically connected to one of each of said contacts;
modular plug means for connecting said contacts to a modular jack, said modular plug means being electrically and mechanically connected to a second end of each of said eight conductors; and
means for permitting insertion of said modular plug means into a 6 or 8 wire modular jack; said means for permitting insertion comprising;
opposite insertable side portions on said modular plug means which are stepped inwardly thereby being insertable into either a 6 or 8 wire modular jack.

25. A modular plug ended adapter comprising:
an electrically insulating housing;
eight electrically conductive contacts partially encased by said housing, each of said contacts being electrically isolated from the others of said contacts;
eight wire conductors leading from said housing, a first end of each of said eight conductors being mechanically and electrically connected to one of each of said contacts;
means for carrying said housing; and
means for attaching said carrying means to said housing, said attaching means being located on said housing, said attaching means comprising snap lock means wherein said snap lock means comprises;
a circular hub having a central opening therein; and
a plurality of slits radially extending from said central opening, said slits defining flexible segments therebetween.

26. The adapter of claim 25 wherein said carrying means comprises:
spring clip means, said spring clip means including means for mating with said attaching means.

27. The adapter of claim 26 wherein said mating means comprises:
a substantially round ball attached to said spring clip means via a shaft.

* * * * *